United States Patent
Wang et al.

(10) Patent No.: US 9,620,548 B1
(45) Date of Patent: Apr. 11, 2017

(54) IMAGE SENSOR WITH WIDE CONTACT

(71) Applicant: Taiwan Semiconductor Manufacturing Co., Ltd., Hsinchu (TW)

(72) Inventors: Tzu-Jui Wang, Kaohsiung (TW); Dun-Nian Yaung, Taipei (TW); Jen-Cheng Liu, Hsinchu (TW); Tzu-Hsuan Hsu, Kaohsiung (TW); Yuichiro Yamashita, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/928,604

(22) Filed: Oct. 30, 2015

(51) Int. Cl.
*H01L 27/14* (2006.01)
*H01L 27/146* (2006.01)

(52) U.S. Cl.
CPC .. *H01L 27/14636* (2013.01); *H01L 27/14621* (2013.01); *H01L 27/14627* (2013.01); *H01L 27/14643* (2013.01); *H01L 27/14685* (2013.01); *H01L 27/14689* (2013.01)

(58) Field of Classification Search
CPC ......... H01L 27/14636; H01L 27/14621; H01L 27/14627; H01L 27/14643; H01L 27/14685; H01L 27/14689
See application file for complete search history.

(56) References Cited

U.S. PATENT DOCUMENTS

| | | | | |
|---|---|---|---|---|
| 7,893,468 | B2 * | 2/2011 | Gambino | H01L 27/14632 257/292 |
| 8,698,934 | B2 * | 4/2014 | Hagiwara | H01L 27/14618 348/294 |
| 8,890,282 | B2 * | 11/2014 | Lee | H01L 23/585 257/506 |
| 9,006,807 | B2 * | 4/2015 | Inoue | H01L 31/0224 257/291 |
| 9,048,158 | B2 * | 6/2015 | Kunikiyo | H01L 27/14603 |
| 9,054,003 | B2 * | 6/2015 | Ahn | H01L 27/1463 |
| 9,054,007 | B2 * | 6/2015 | Hu | H01L 27/14643 |
| 9,136,153 | B2 * | 9/2015 | Or-Bach | G11C 8/16 |
| 9,293,490 | B2 * | 3/2016 | Chien | H01L 27/14623 |
| 2009/0149023 | A1 * | 6/2009 | Koyanagi | H01L 21/76898 438/666 |
| 2009/0173976 | A1 * | 7/2009 | Augusto | H01L 27/14669 257/292 |
| 2011/0068381 | A1 * | 3/2011 | Barbier | H01L 27/14609 257/292 |

(Continued)

*Primary Examiner* — Ida M Soward
(74) *Attorney, Agent, or Firm* — Birch, Stewart, Kolasch & Birch, LLP

(57) ABSTRACT

An image sensor structure is provided. The image sensor structure includes a substrate including a first light sensing region and a second light sensing region. The image sensor structure further includes an isolation structure formed through the substrate to separate the first light sensing region and the second light sensing region and a first source/drain structure and a second source/drain structure formed at a front side of the substrate. In addition, the first source/drain structure and the second source/drain structure are located at opposite sides of the isolation structure. The image sensor structure further includes a contact formed over the isolation structure, a portion of the first source/drain structure, and a portion of the second source/drain structure.

20 Claims, 14 Drawing Sheets

(56) References Cited

U.S. PATENT DOCUMENTS

| | | | |
|---|---|---|---|
| 2012/0008026 A1* | 1/2012 | Akiyama | H01L 27/14603 348/294 |
| 2012/0025199 A1 | 2/2012 | Chen et al. | |
| 2013/0181349 A1* | 7/2013 | Koyama | H01L 23/481 257/741 |
| 2014/0042506 A1 | 2/2014 | Ramberg et al. | |
| 2014/0077271 A1* | 3/2014 | Fujii | H01L 27/1461 257/239 |
| 2014/0124951 A1* | 5/2014 | Lee | H01L 23/585 257/774 |
| 2014/0264505 A1 | 9/2014 | Chiu et al. | |
| 2015/0060967 A1* | 3/2015 | Yokoyama | H01L 27/1463 257/292 |
| 2015/0214266 A1 | 7/2015 | Kao et al. | |
| 2016/0181301 A1* | 6/2016 | Terada | H01L 27/1464 257/228 |
| 2016/0204158 A1* | 7/2016 | Hsu | H01L 27/14643 257/459 |
| 2016/0226222 A1* | 8/2016 | Cheng | H01L 31/173 |

* cited by examiner

IMAGE SENSOR WITH WIDE CONTACT

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
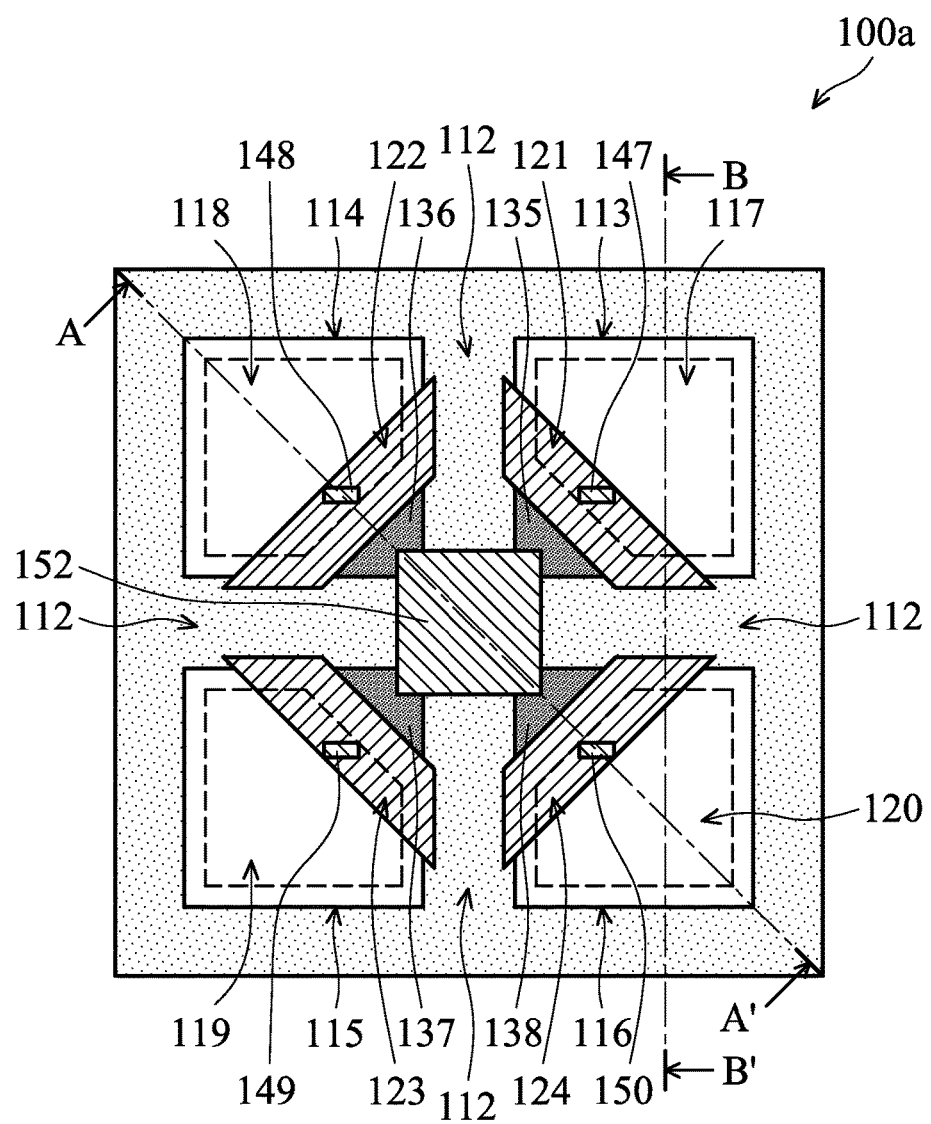
FIG. 1 is a top-view representation of a pixel layout of an image sensor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of an integrated circuit (IC) structure and methods for forming the same are provided. In some embodiments, the IC structure includes an image sensor. The image sensor includes an isolation structure isolating two adjacent light sensing regions. Source/drain structures (in image sensor field, also called a floating node) are formed adjacent to the isolation structure. A contact is formed over the isolation structure, and the contact is wider than the isolation structure, so that the contact also covers portions of source/drain structures formed adjacent to the isolation structure. Accordingly, the source/drain structures can be electrically connected through the contact.

FIG. 1 is a pixel layout of an image sensor structure 100a in accordance with some embodiments. FIGS. 2A to 2L are cross-sectional representations of various stages of forming image sensor structure 100a illustrated along line A-A' shown in FIG. 1 in accordance with some embodiments. It should be noted that image sensor structure 100a illustrated in FIGS. 2A to 2L has been simplified for the sake of clarity so that concepts of the present disclosure can be better understood. Therefore, in some other embodiments, additional features are added in image sensor structure 100a, and some of the elements are replaced or eliminated.

A substrate 102 is received, as shown in FIG. 1A in accordance with some embodiments. In some embodiments, substrate 102 is a semiconductor substrate including silicon. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

Figure 2A:
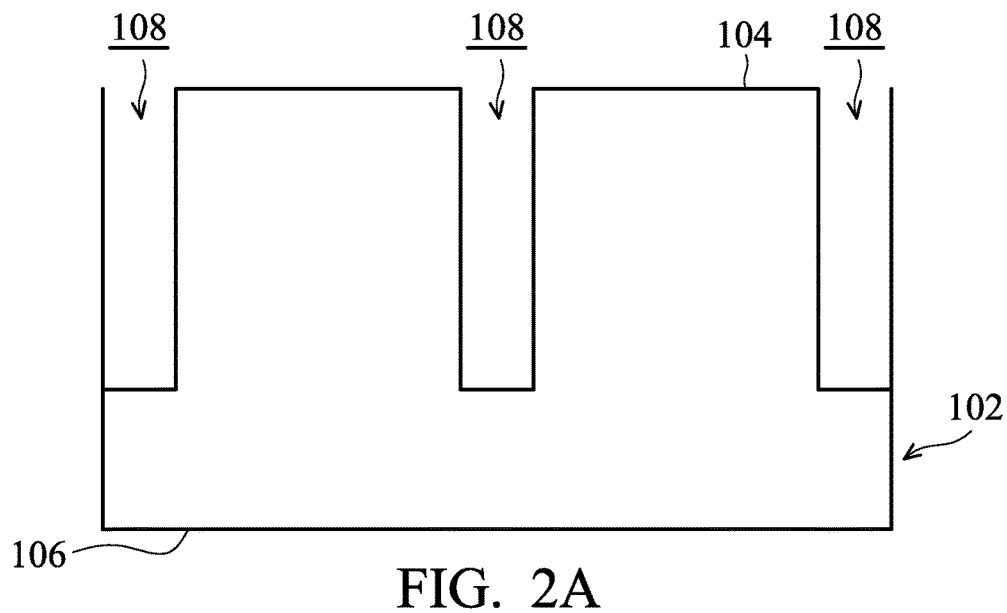
FIGS. 2A to 2L are cross-sectional representations of various stages of forming the image sensor structure illustrated along line A-A' shown in FIG. 1 in accordance with some embodiments.

As shown in FIG. 2A, substrate 102 has a front side 104 and a back side 106. Isolation trenches 108 are formed in substrate 102, as shown in FIG. 2A in accordance with some embodiments. In some embodiments, isolation trenches 108 are formed by forming a hard mask structure over front side 104 of substrate 102, patterning the hard mask structure to form openings in the hard mask structure, and etching substrate 102 through the openings. As shown in FIG. 2A, isolation trenches 108 are formed from front side 104 of substrate 102.

Figure 2B:
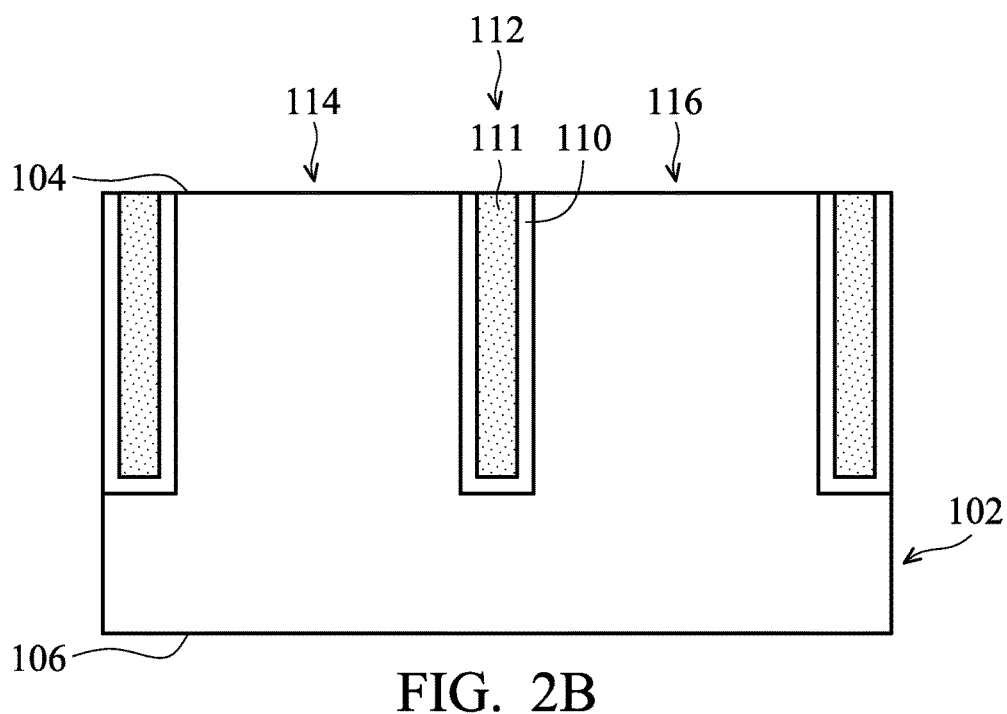

After isolation trenches 108 are formed, liners 110 are formed on the bottom surface and the sidewalls of isolation trenches 108, as shown in FIG. 2B in accordance with some embodiments. Liners 110 may be formed by annealing, chemical vapor deposition (CVD), physical vapor deposition, (PVD), atomic layer deposition (ALD), spin-on coating, implantation process, and/or other applicable processes. Liners 110 may be made of a dielectric material, such as silicon nitride, silicon oxide, silicon oxynitride, silicon carbide, or other applicable dielectric materials.

After liners 110 are formed, isolation material 111 is formed in isolation trenches 108 to form isolation structures 112, as shown in FIG. 2B in accordance with some embodiments. That is, isolation structure 112 includes liner 110 and isolation material 111 in accordance with some embodiments. However, in some other embodiments, liner 110 is not formed. In some embodiments, isolation structures 112 are deep trench isolation (DTI) structures. In some embodiments, isolation structures 112 are formed by depositing an isolation material in isolation trenches 108. The isolation materials include silicon nitride, silicon oxide, and polysilicon in accordance with some embodiments.

In some embodiments, isolation structure 112 has a thickness in a range from about 1 μm to about 4 μm. The thickness of isolation structure 112 should be thick enough so that the light sensing regions formed afterwards can be separated by isolation structure 112. In some embodiments, isolation structure 112 has a width in a range from about 0.05 μm to about 0.4 μm. If the width of isolation structure 112 is too large, the size of the light sensing regions formed afterwards may become relatively small. On the other hand, if the width of isolation structure 112 is too small, the deposition of the isolation material in isolation trench 108 may become challenging.

Figure 2C:
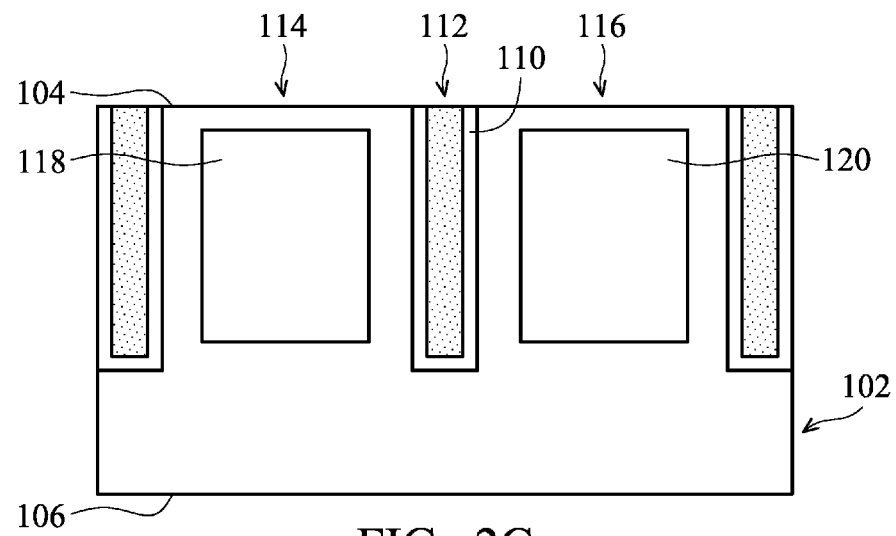

As shown in FIG. 2B, isolation structure 112 is formed from front side 104 of substrate 102, and substrate 102 is divided into a first region 114 and a second region 116 by isolation structure 112. After isolation structure 112 is formed, a first light sensing region 118 is formed in first region 114 of substrate 102, and a second light sensing region 120 is formed in second region 116 of substrate 102, as shown in FIG. 2C in accordance with some embodiments.

In some embodiments, the thickness of first light sensing region 118 and second light sensing region 120 are no greater than (i.e. smaller than or the same as) the thickness $T_1$ of isolation structure 112. That is, first light sensing region 118 and second light sensing region 120 are formed from front side 104 of substrate 102, and the bottom surfaces of first light sensing region 118 and second light sensing region 120 are no lower than the bottom surface of isolation structure 112, as shown in FIG. 2C in accordance with some embodiments. Since first light sensing region 118 and second light sensing region 120 are formed at the opposite sides of isolation structure 112 and has a thickness than $T_1$, first light sensing region 118 and second light sensing region 120 can be isolated by isolation structure 112.

In some embodiments, first light sensing region 118 and second light sensing region 120 are configured to sense (detect) light of different wavelengths. For examples, first light sensing region 118 and second light sensing region 120 may individually correspond to a range of wavelengths of red light, green light, or blue light. First light sensing region 118 and second light sensing region 120 may be doped regions having n-type and/or p-type dopants formed in substrate 102. First light sensing region 118 and second light sensing region 120 may be formed by an ion implantation process, diffusion process, or other applicable processes.

Figure 2D:
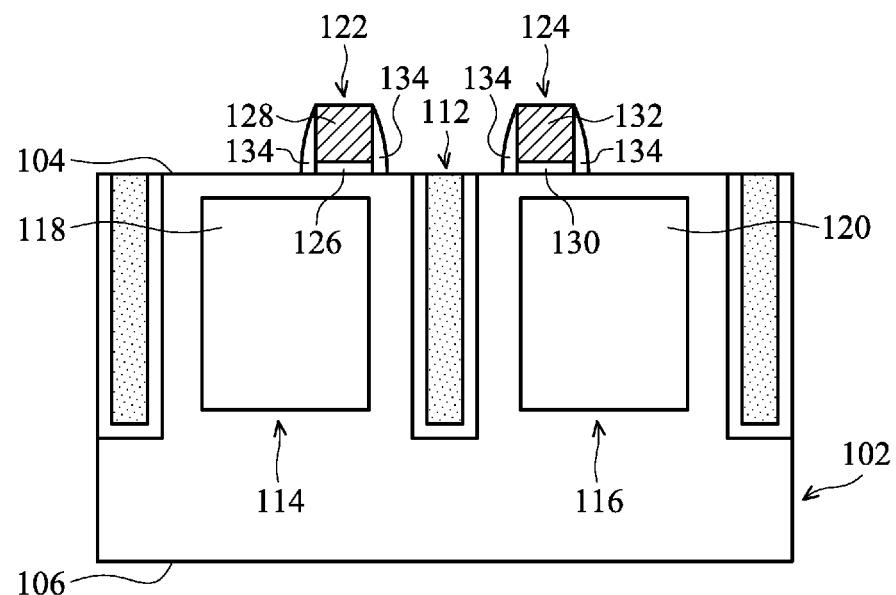

After first light sensing region 118 and second light sensing region 120 are formed, a first gate structure 122 is formed over first region 114 of substrate 102, and a second gate structure 124 is formed over second region 116 of substrate 102, as shown in FIG. 2D in accordance with some embodiments. In some embodiments, first gate structure 122 includes a first gate dielectric layer 126 and a first gate electrode layer 128, and second gate structure 124 includes a second gate dielectric layer 130 and a second gate electrode layer 132. Spacers 134 are formed on the sidewalls of first gate structure 122 and second gate structure 124.

In some embodiments, first gate dielectric layer 126 and second gate dielectric layer 130 are made of oxide. In some embodiments, first gate dielectric layer 126 and second gate dielectric layer 130 are made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, first gate electrode layer 128 and second gate electrode layer 132 are made of polysilicon. In some embodiments, first gate electrode layer 128 and second gate electrode layer 132 are made of conductive materials, such as aluminum, copper, tungsten, titanium, tantalum, or other applicable materials. First gate structure 122 and second gate structure 124 may be formed by forming a gate dielectric layer and a conductive layer over front side 104 of substrate 102 and patterning the gate dielectric layer and the conductive layer.

In some embodiments, spacers 134 are made of silicon nitride, silicon oxide, silicon oxynitride, silicon oxycarbide (SiOC), silicon oxycarbonnitride (SiOCN), silicon carbide, or other applicable dielectric materials. Spacers 134 may be formed by forming a dielectric layer over front side 104 of substrate 102 to cover first gate structure 122 and second gate structure 124 and etching the dielectric layer.

Figure 2E:
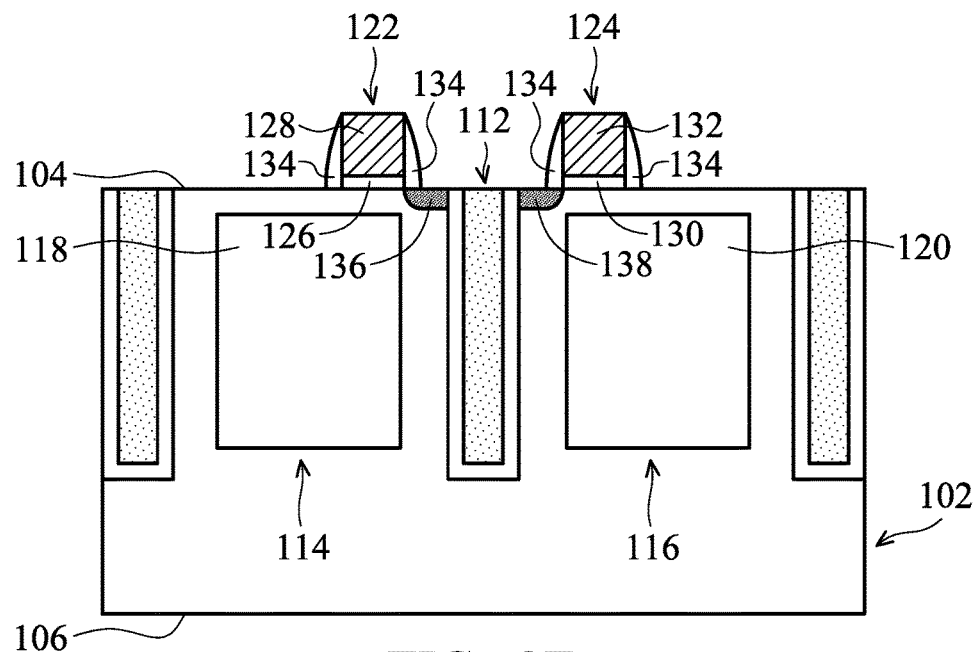

After first gate structure 122 and second gate structure 124 are formed, a first source/drain structure 136 is formed adjacent to first gate structure 122, and a second source/drain structure 138 is formed adjacent to second gate structure 124, as shown in FIG. 2E in accordance with some embodiments. In some embodiments, first source/drain structure 136 and second source/drain structure 138 are formed by implanting dopants into substrate 102 from front side 104 of substrate 102. In some embodiments, the dopants are also doped in the upper portion of isolation structure 112. In some embodiments, first source/drain structure 136 and second source/drain structure 138 are formed by recessing front side 104 of substrate 102 to form recesses and epitaxial growing strained materials in the recesses.

As shown in FIG. 2E, first source/drain structure 136 is formed in first region 114 of substrate 102 and is adjacent to one side of isolation structure 112, and second source/drain structure 138 is formed in second region 116 of substrate 102 and is adjacent to the other side of isolation structure 112. In some embodiments, the top surface of first source/drain structure 136, the top surface of isolation structure 112, and the top surface of second source/drain structure 138 are substantially level with one another.

In some embodiments, the sizes of first source/drain structure 136 and second source/drain structure 138 are relatively small since a wide contact will be formed later on. Therefore, there can be a greater spacer to form first light sensing region 118 and second light sensing region 120, and the quantum efficiency of the resulting image sensor 100a can be improved (Details will be described later).

Figure 2F:
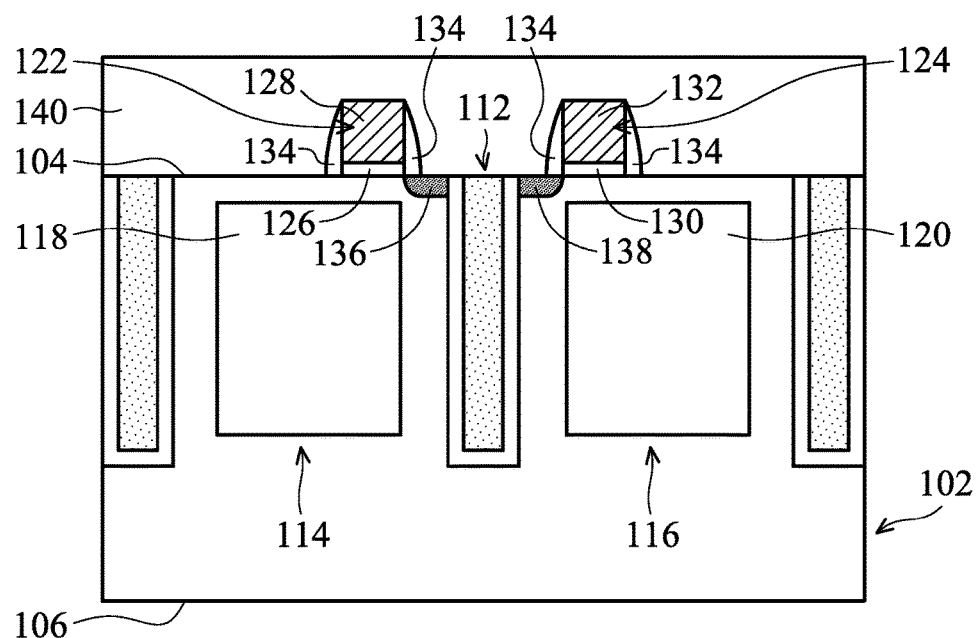

After first source/drain structure 136 and second source/drain structure 138 are formed, an interlayer dielectric layer 140 is formed over front side 104 of substrate 102, and first gate structure 122 and second gate structure 124 are covered by interlayer dielectric layer 140, as shown in FIG. 2F in accordance with some embodiments. Interlayer dielectric layer 140 may include multilayers made of multiple dielectric materials, such as silicon oxide, silicon nitride, silicon oxynitride, and/or other applicable low-k dielectric materials. Interlayer dielectric layer 140 may be formed by chemical vapor deposition (CVD), physical vapor deposition, (PVD), atomic layer deposition (ALD), spin-on coating, or other applicable processes.

Figure 2G:
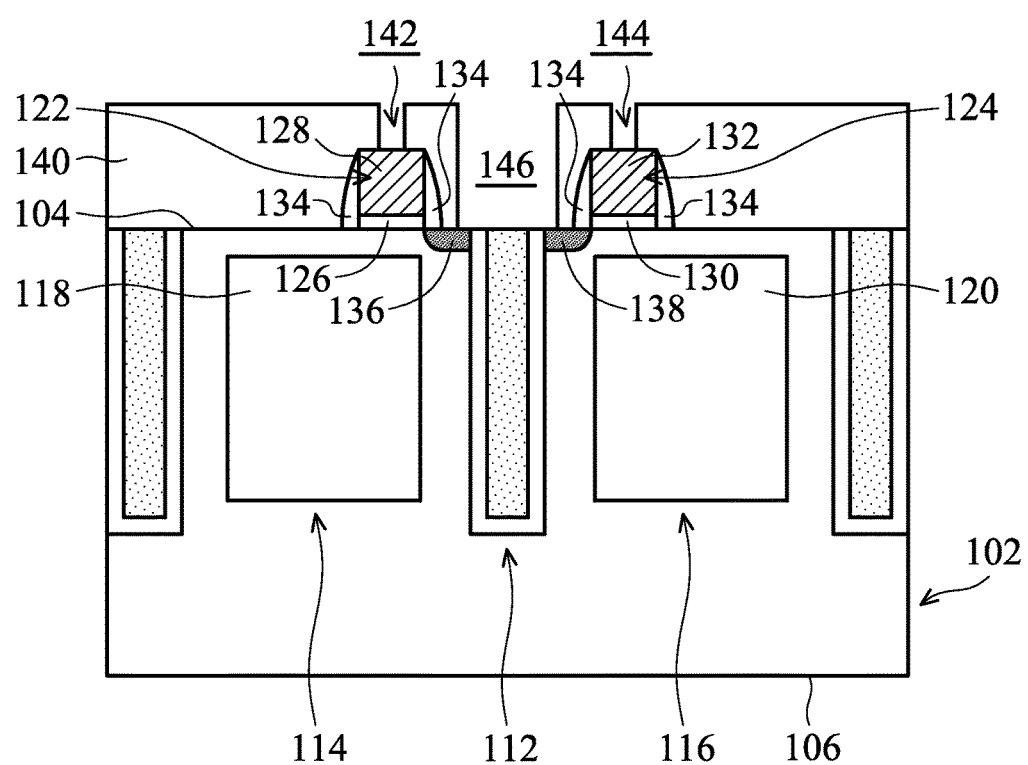

Next, a first contact trench 142, a second contact trench 144, and a wide contact trench 146 are formed through interlayer dielectric layer 140, as shown in FIG. 2G in accordance with some embodiments. First contact trench 142 is formed over first gate structure 122, second contact trench 144 is formed over second gate structure 124, and wide contact trench 146 is formed over isolation structure 112. In addition, as shown in FIG. 2G, wide contact trench 146 has a relatively great width. In some embodiments, the width of wide contact trench 146 is greater than the width of first contact trench 142 and the width of second contact trench 144.

Furthermore, the width of wide contact trench 146 is greater than the width of isolation structure 122 in accordance with some embodiments. Since wide contact trench 146 is wider than isolation structure 112, a portion of first source/drain structure 136 and a portion of second source/drain structure 138 formed adjacent to isolation structure 112 are also exposed by wide contact trench 146, as shown in FIG. 2G in accordance with some embodiments.

In some embodiments, the width of wide contact trench 146 is in a range from about 0.1 μm to about 0.5 μm. Wide contact trench 146 should be wide enough, or the contact formed in the wide contact trench afterwards will not be wide enough to connect both first source/drain structure 136 and second source/drain structure 138 (Details will be described later).

Figure 2H:
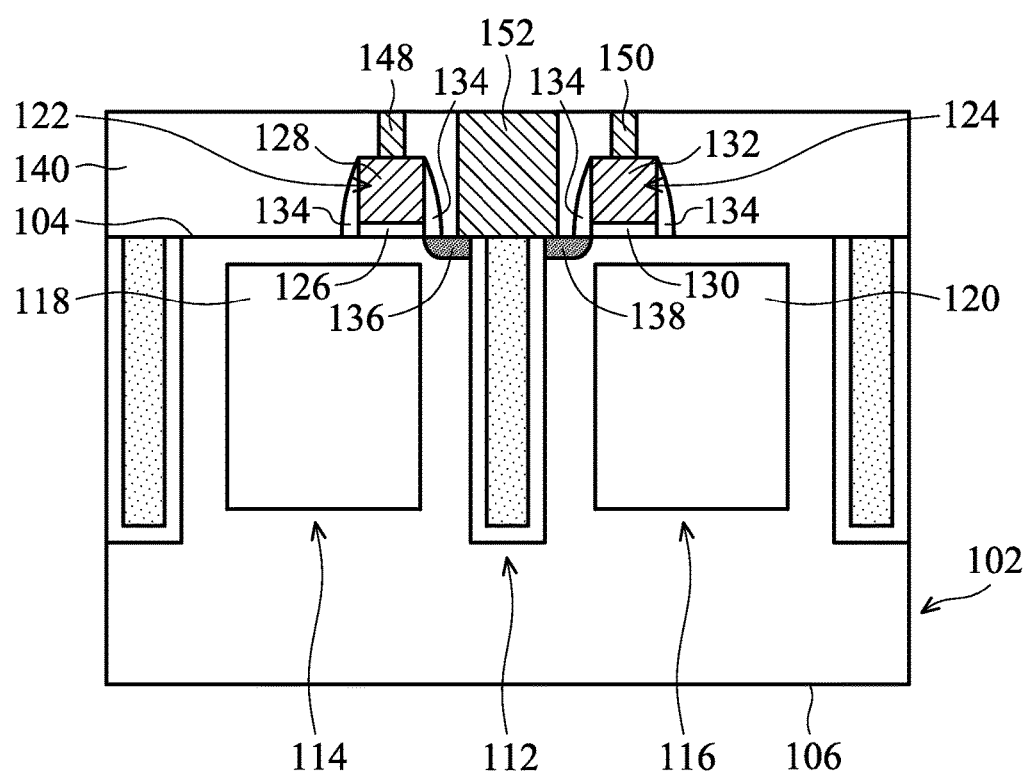

After first contact trench 142, second contact trench 144, and wide contact trench 146 are formed, a first contact 148, a second contact 150, and a wide contact 152 are formed, as shown in FIG. 2H in accordance with some embodiments. First contact 148 is formed in first contact trench 148 and is electrically contacted with first gate structure 122. Second contact 150 is formed in second contact trench 144 and is electrically contacted with second gate structure 124. Wide contact 152 is formed in wide contact trench 146 and is electrically contacted with first source/drain structure 136 and second source/drain structure 138.

Since wide contact 152 is formed in wide contact trench 146, wide contact 152 has a width substantially equal to the width of third contact trench, which is greater than the width of isolation structure 112 in accordance with some embodiments. Accordingly, wide contact 152 is formed on a portion of first source/drain structure 136, isolation structure 112, and a portion of second source/drain structure 138 in accordance with some embodiments.

As shown in FIG. 2H, wide contact 152 overlaps with isolation structure 112, a portion of first source/drain structure 136, and a portion of second source/drain structure 138. In some embodiments, wide contact 152 is in direct contact with a portion of the top surface of first source/drain structure 136, the top surface of isolation structure 112, and a portion of the top surface of second source/drain structure 138. By forming wide contact 152 having a relatively great width, first source/drain structure 136 and second source/drain structure 138 can be electrically connected without requiring additional conductive features. In some embodiments, first source/drain structure 136 and second source/drain structure 138 are electrically connected with wide contact 152 and can be seen as a floating diffusion node.

First contact 148, second contact 150, and wide contact 152 may be formed by filling first contact trench 142, second contact trench 144, and wide contact trench 146 by a conductive material. In some embodiments, the conductive material includes aluminum (Al), copper (Cu), tungsten (W), titanium (Ti), tantulum (Ta), titanium nitride (TiN), tantalum nitride (TaN), nickel silicide (NiS), cobalt silicide (CoSi), tantulum carbide (TaC), tantulum silicide nitride (TaSiN), tantalum carbide nitride (TaCN), titanium aluminide (TiAl), titanium aluminide nitride (TiAlN), other applicable conductive materials, or a combination thereof.

In addition, first contact 148, second contact 150, and wide contact 152 may further include a liner and/or a barrier layer. For example, a liner (not shown) may be formed on the sidewalls and bottom of the contact trench. The liner may be silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Figure 2I:
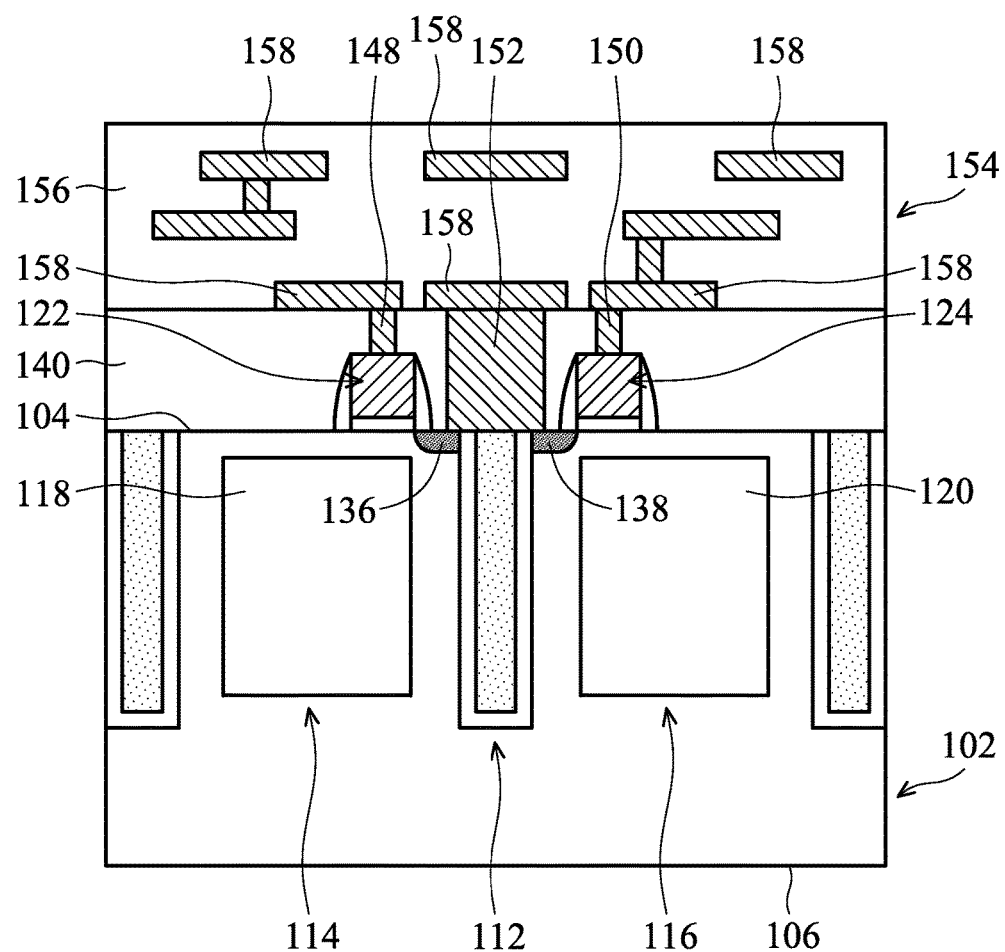

After first contact 148, second contact 150, and wide contact 152 are formed, an interconnect structure 154 is formed over interlayer dielectric layer 140, as shown in FIG. 2I in accordance with some embodiments. That is, interconnect structure 154 is formed over front side 104 of substrate 102. In some embodiments, interconnect structure 154 includes a dielectric layer 156 and conductive features 158 formed in dielectric layer 156.

In some embodiments, dielectric layer 156 is an intermetal dielectric (IMD) layer. In some embodiments, dielectric layer 156 includes multilayers made of multiple dielectric materials, such as silicon oxide, silicon nitride, silicon oxynitride, phosphosilicate glass (PSG), borophosphosilicate glass (BPSG), or other applicable low-k dielectric materials. Dielectric layer 156 may be formed by a chemical vapor deposition (CVD), physical vapor deposition, (PVD), atomic layer deposition (ALD), spin-on coating, or other applicable processes.

Conductive features 158 may be configured to connect various features or structures of image sensor structure 100a. For example, conductive features 158 are used to interconnect first contact 148, second contact 150, and wide contact 152 formed over substrate 102. Conductive features 158 may be vertical interconnects, such as vias and contacts, and/or horizontal interconnects, such as conductive lines. In some embodiments, conductive features 158 are made of conductive materials, such as aluminum, aluminum alloy, copper, copper alloy, titanium, titanium nitride, tungsten, polysilicon, or metal silicide.

It should be noted that conductive features 158 shown in FIG. 2I are merely examples for better understanding the concept of the disclosure, and the scope of disclosure is not intended to be limiting. That is, conductive features 112 may be arranged in various ways in various embodiments.

Figure 2J:
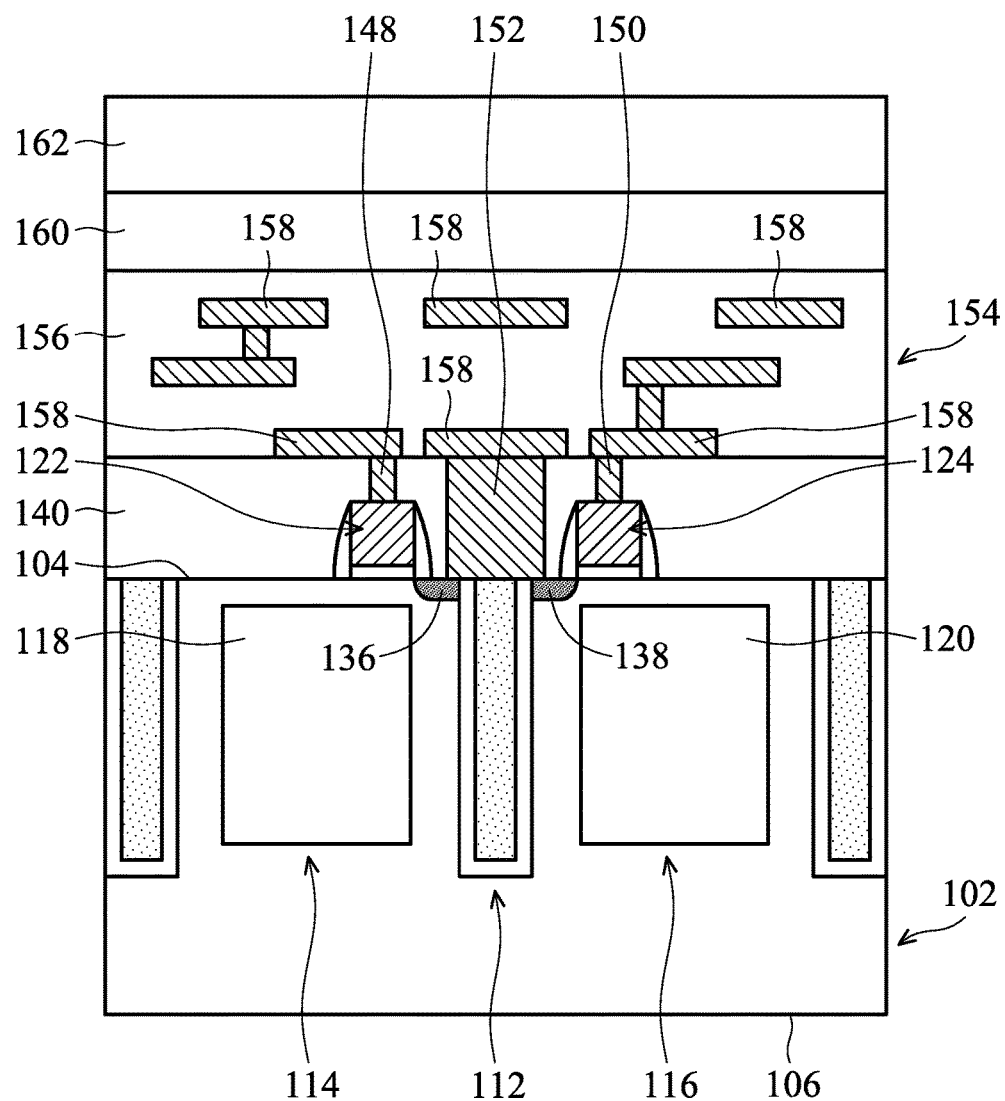

After interconnect structure 154 is formed, a buffer layer 160 is formed over interconnect structure 154, as shown in FIG. 2J in accordance with some embodiments. In some embodiments, buffer layer 160 is made of silicon oxide, silicon nitride, or other applicable dielectric materials. Buffer layer 154 may be formed by CVD, PVD, or other applicable techniques. In some embodiments, buffer layer 160 is planarized to form a smooth surface by a chemical-mechanical-polishing (CMP) process.

Next, a carrier substrate 162 is bonded with buffer layer 160, as shown in FIG. 2J in accordance with some embodiments. Carrier substrate 162 is configured to provide mechanical strength and support for processing back side 106 of substrate 102 in subsequent processes. Carrier substrate 162 may be similar to substrate 102 or may be a glass substrate.

Figure 2K:
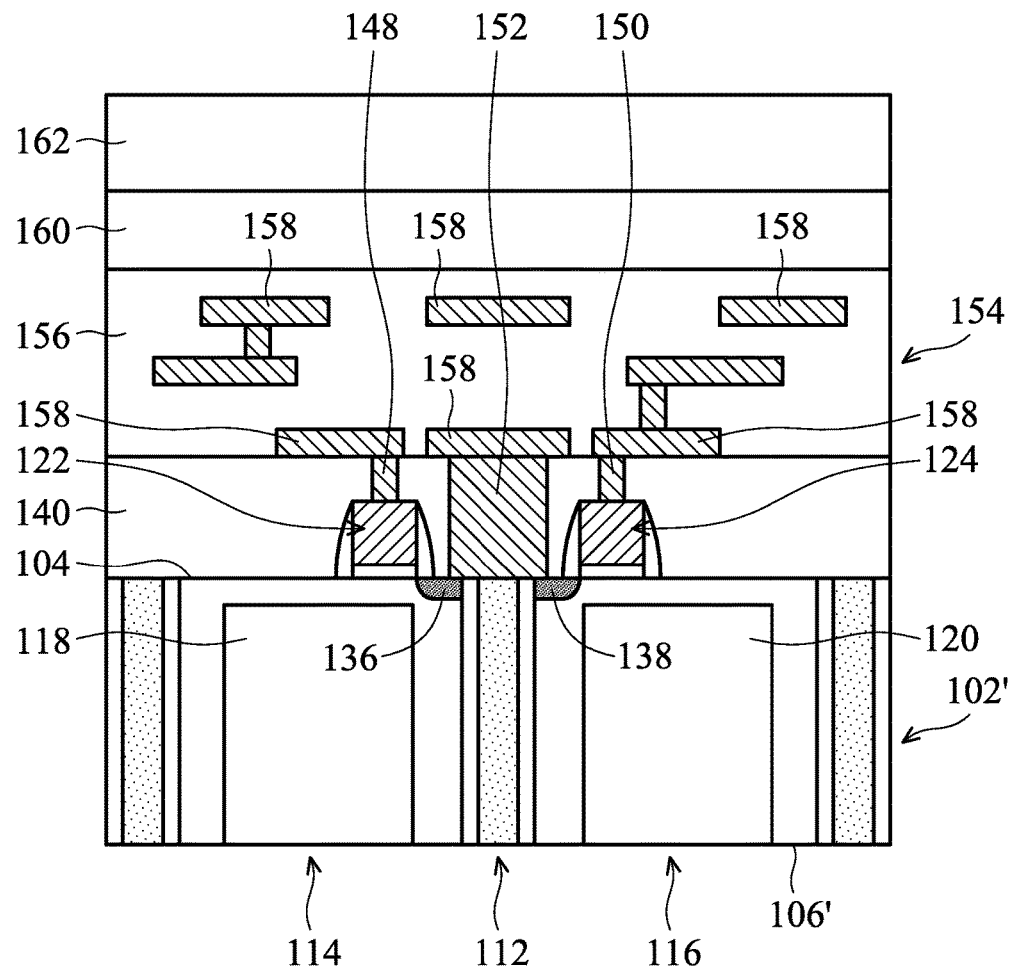

Afterwards, back side 106 of substrate 106 is polished to expose first light sensing region 118 and second light sensing region 120, as shown in FIG. 2K in accordance with some embodiments. Accordingly, a thinned substrate 102' having a back side 106' is formed. As shown in FIG. 2K, first light sensing region 118 and second light sensing region 120 are exposed from back side 106' of substrate 102'. In some embodiments, substrate 102 is polished by a chemical mechanical polishing (CMP) process. In some embodiments, a portion of isolation structure 120 is removed during the polishing process. Accordingly, isolation structure 112 extends from front side 104 of thinned substrate 102' to thinned back side 106' of thinned substrate 102', as shown in FIG. 2K.

Figure 2L:
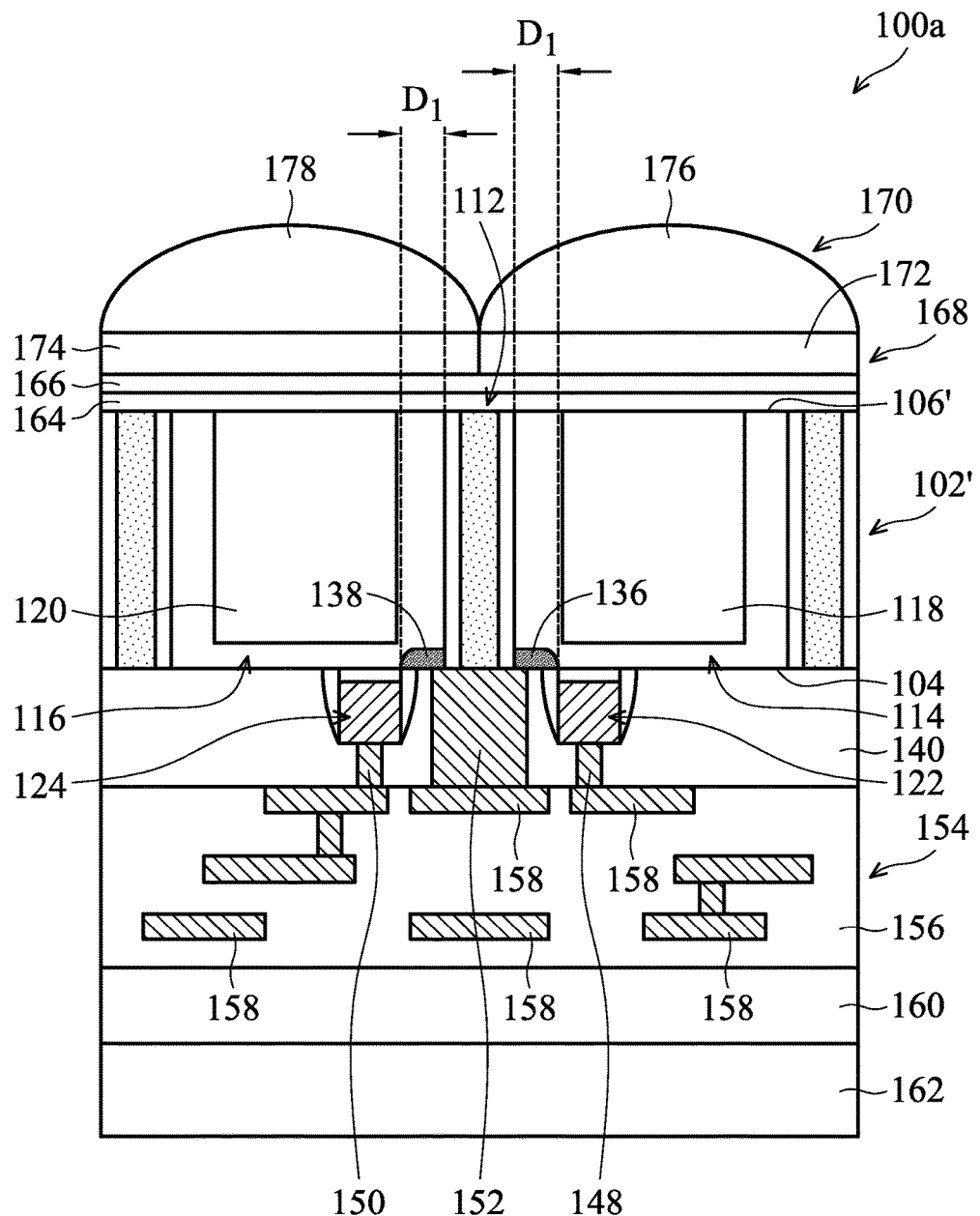

Next, antireflective layer 164 is formed over back side 106' of thinned substrate 102', such that exposed first light sensing region 118 and second light sensing region 120 are covered by antireflective layer 164, as shown in FIG. 2L in accordance with some embodiments. In some embodiments, antireflective layer 164 is made of silicon carbide nitride, silicon oxide, or the like. After antireflective layer 164 is formed, a passivation layer 166 is formed over antireflective layer 164, as shown in FIG. 2L in accordance with some embodiments. In some embodiments, passivation layer 166 is made of silicon nitride or silicon oxynitride.

After passivation layer 166 is formed, color filter layer 168 is formed over passivation layer 166, and a microlens layer 170 is disposed over color filter layer 168, as shown in FIG. 2L in accordance with some embodiments. Color filter layer 168 may include more than one color filter. In some embodiments, color filter layer 168 includes a first color filter 172 and a second color filter 174. In some embodiments, first color filter 172 and second color filter 174 are respectively aligned with first light sensing region 118 and second light sensing region 120. In some embodiments, first color filter 172 and second color filter 174 are made of a dye-based (or pigment-based) polymer for filtering out a specific frequency band of radiation. In some embodiments, first color filter 172 and second color filter 174 are made of resin or other organic-based material having color pigments.

In some embodiments, microlens layer 170 disposed on color filter layer 168 includes a first microlens 176 and a second microlens 178. As shown in FIG. 2L, first microlens 176 and second microlens 178 are respectively aligned with first color filter 172 and second color filter 174 and therefore are respectively aligned with first light sensing region 118 and second light sensing region 120. However, it should be noted that microlens layer 170 may be arranged in various positions in various applications.

Referring back to FIG. 1, image sensor structure 100a includes first region 114 and second region 116 separated by isolation structure 112 in accordance with some embodiments. First light sensing region 118 is formed in first region 114, and second light sensing region 120 is formed in second region 116. In addition, first gate structure 122 is formed over first region 114, and first source/drain structure 136 is formed adjacent to first gate structure 122. Second gate structure 124 is formed over second region 116, and second source/drain structure 138 is formed adjacent to second gate structure 124. First contact 148 is formed over first gate structure 122, and second contact 150 is formed over second gate structure 124.

As described previously, the relatively wide contact 152 is formed over isolation structure 112 and further extends over a portion of first source/drain structure 136 and a portion of second source/drain structure 138. Accordingly, first source/drain structure 136 and second source/drain structure 138 can be directly connected by wide contact 152. Additional conductive features and complicated manufacturing and aligning processes are not required.

In addition, the formation of wide contact 152 enables to save the space for forming additional conductive features. Therefore, the size of first source/drain structure 136 and second source/drain structure 138 can be relatively small. In some embodiments, a shortest distance $D_1$ between the sidewall of first gate structure 122 and the sidewall of isolation structure 112 is smaller than 150 nm. In some embodiments, a shortest distance $D_1$ between the sidewall of first gate structure 122 and the sidewall of isolation structure 112 is in a range from about 100 nm to about 150 nm. When the distance between first gate structure 122 (or second gate structure 124) and isolation structure 112 is reduced, the space form forming first light sensing region 118 (or second light sensing region 120) can be increased. Therefore, the performance of image sensor structure 100a can be improved. In some embodiments, the width of first light sensing region 118 (or second light sensing region 120) is in a range from about 0.6 μm to about 0.95 μm.

Similarly, a third region 113 and a fourth region 115 are also separated by isolation structure 112, and a third light sensing region 117 is formed in third region 113 and a fourth light sensing region 119 is formed in fourth region 115 in accordance with some embodiments. In addition, a third gate structure 121 is formed over third region 113, and a third source/drain structure 135 is formed adjacent to third gate structure 121. A fourth gate structure 123 is formed over fourth region 115, and a fourth source/drain structure 137 is formed adjacent to fourth gate structure 123. In addition, a third contact 147 is formed over third gate structure 121, and a fourth contact 149 is formed over fourth gate structure 123. Similar to those described previously, wide contact 152 is formed over isolation structure 112 and further extends over a portion of third source/drain structure 135 and a portion of fourth source/drain structure 137. Accordingly, first source/drain structure 136, second source/drain structure 138, third source/drain structure 135, and fourth source/drain structure 137 are all directly connected by wide contact 152 in accordance with some embodiments.

Figure 3:
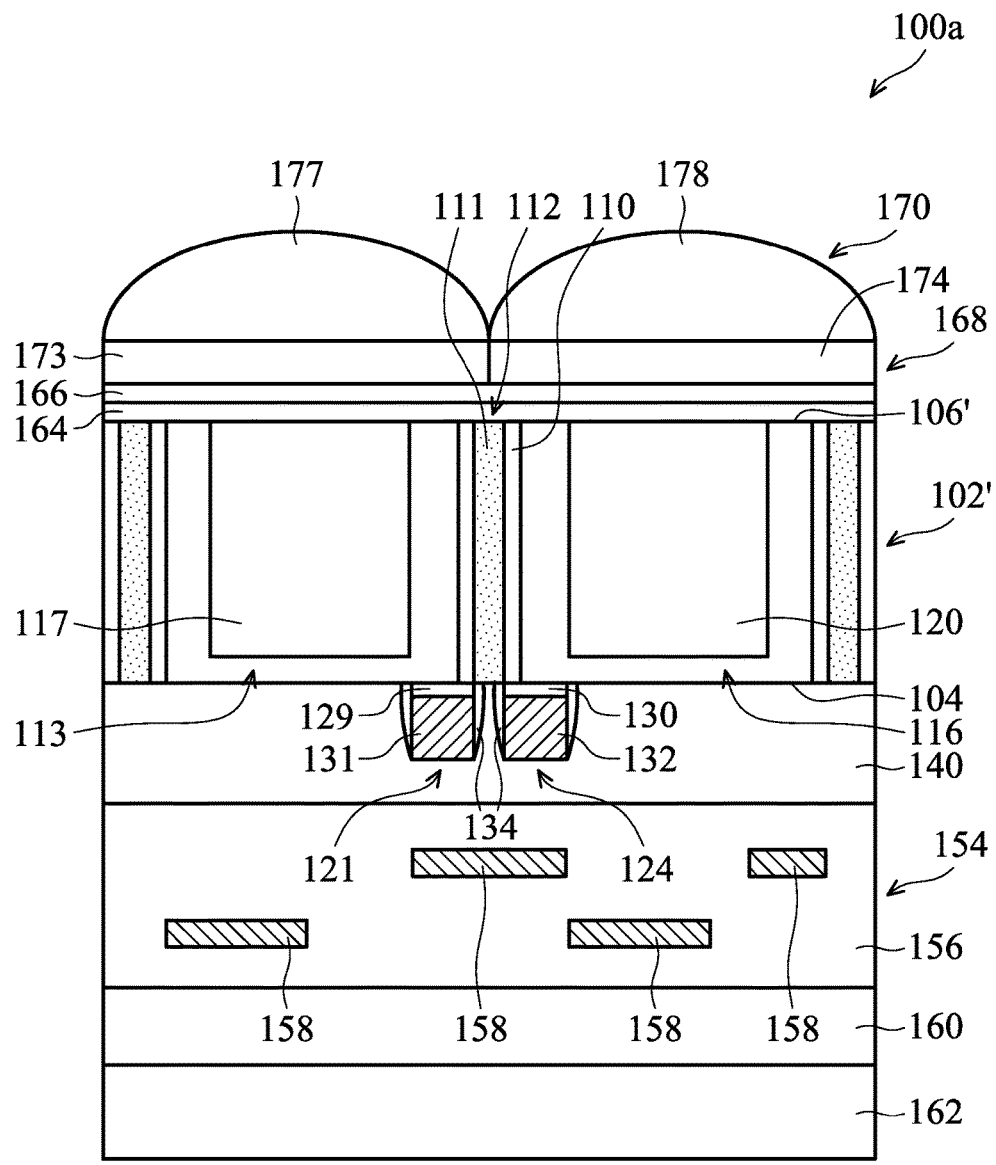
FIG. 3 is a cross-sectional representation of the image sensor structure illustrated along line B-B' shown in FIG. 1 in accordance with some embodiments.

FIG. 3 is a cross-sectional representation of image sensor structure 100a illustrated along line B-B' shown in FIG. 1 in accordance with some embodiments. As shown in FIG. 3, third light sensing region 117 and second light sensing region 120 are formed in thinned substrate 102' and are separated by isolation structure 112. In addition, second gate structure 124, which includes gate dielectric layer 130 and gate electrode layer 132, and third gate structure 121, which includes a gate dielectric layer 129 and a gate electrode layer 131, are formed on front side 104 of thinned substrate 102'.

As described previously, antireflective layer 164 is formed over back side 106' of thinned substrate 102' to cover exposed third light sensing region 117 and second light sensing region 120, and passivation layer 166, color filter layer 168, and microlens layer 170 are formed over antireflective layer 164, as shown in FIG. 3 in accordance with some embodiments. In addition, color filter layer 168 further includes a third color filter 173, and microlens layer further includes a third microlens 177.

As shown in FIG. 3, although wide contact 152 formed over isolation structure 112 has a relatively great width, the contacts formed at other portions of image sensor structure 100a may still remain their original widths. Therefore, the process described above may be applied to present manufacturing processes without using complicated additional processes or altering too many original processes.

Figure 4A:
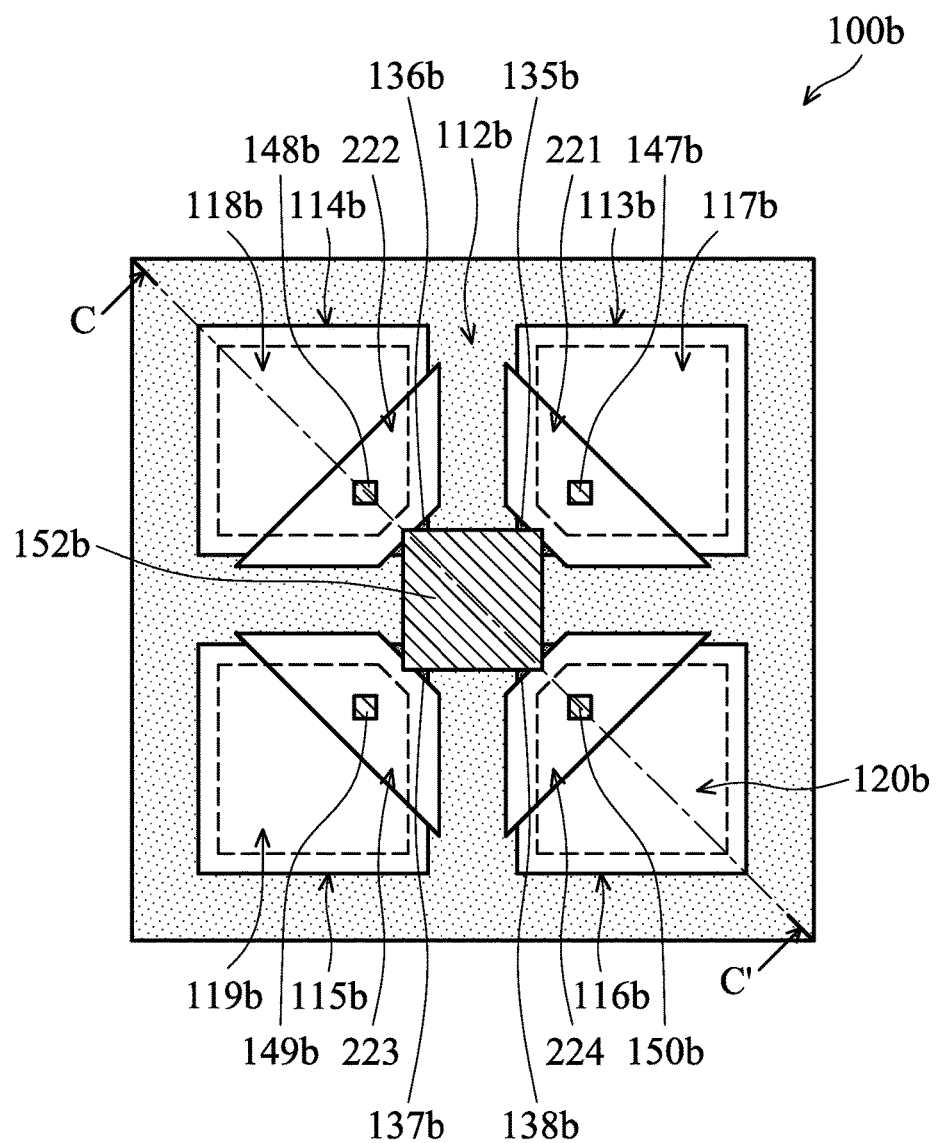
FIG. 4A is a top-view representation of a pixel layout of an image sensor structure in accordance with some embodiments.
Figure 4B:
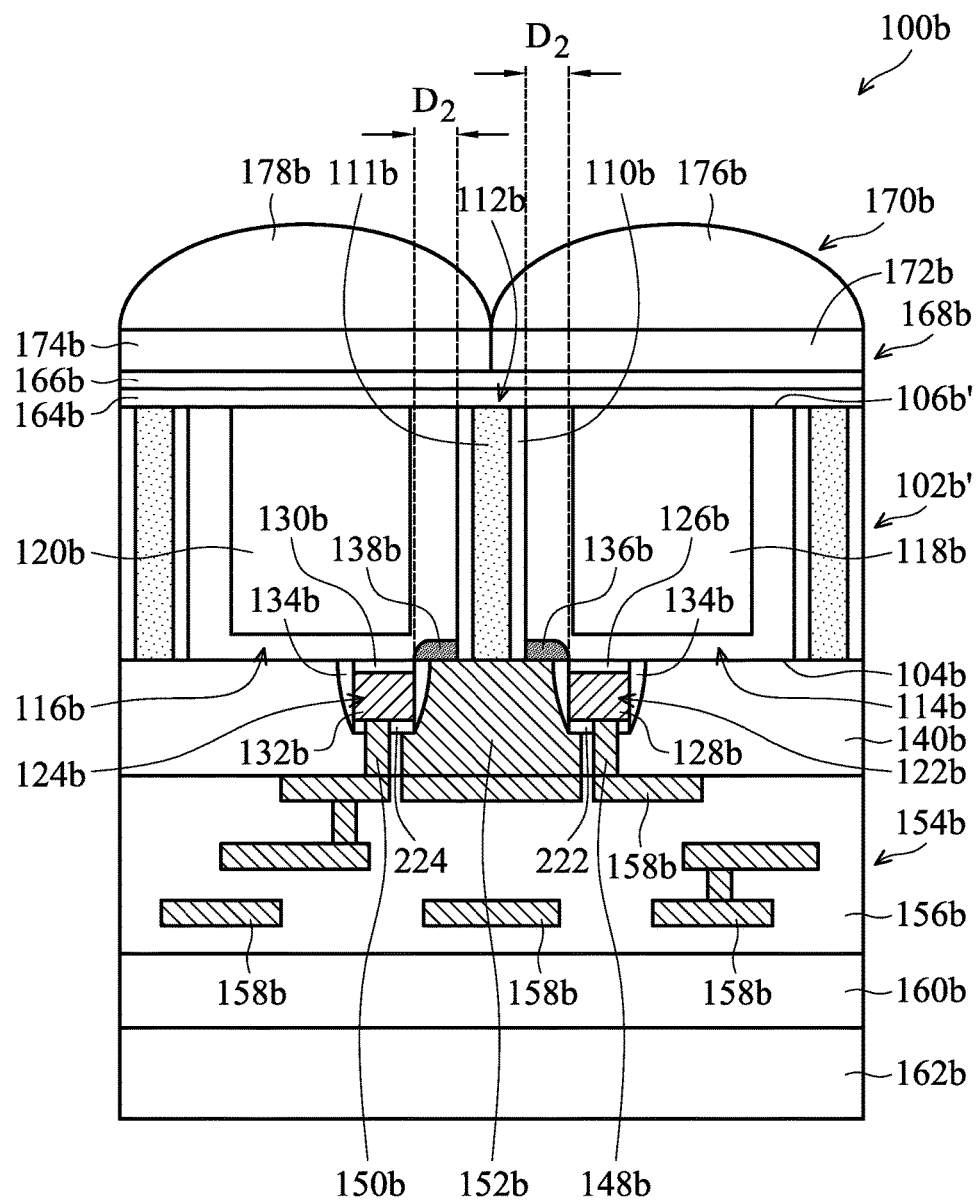
FIG. 4B is a cross-sectional representations of the image sensor structure illustrated along line C-C' shown in FIG. 4A in accordance with some embodiments.

FIG. 4A is a pixel layout of an image sensor structure 100b in accordance with some embodiments. FIG. 4B is a cross-sectional representation of image sensor structure 100b illustrated along line C-C' shown in FIG. 4A in accordance with some embodiments. Image sensor structure 100b is similar to image sensor structure 100a described previously, except hard mask structures are formed over the gate structures, so that a wide contact can be self-aligned to the source/drain structures. Some processes and materials used to form image sensor structure 100b may be similar to, or the same as, those used to form image sensor structure 100a described previously and are not repeated herein.

Similar to image sensor structure 100a, a thinned substrate 102b' is separated into a first region 114b, a second region 116b, a third region 113b, and a fourth region 115b by isolation structures 112b. A first light sensing region 118b, a second light sensing region 120b, a third light sensing region 117b, and a fourth light sensing region 119b are formed in first region 114b, second region 116b, third region 113b, and fourth region 115b respectively. In some embodiments, isolation structure 112b includes liners 110b and an isolation material 111b formed between liners 110b.

In addition, a first gate structure 122b, a second gate structure 124b, a third gate structure (not shown), and a fourth gate structure (not shown) are formed over first region 114b, second region 116b, third region 113b, and fourth region 115b respectively. As shown in FIG. 4B, first gate structure 122b includes a first gate dielectric layer 126b and a first gate electrode layer 128b formed over first gate dielectric layer 126b in accordance with some embodiments. In addition, a first hard mask structure 222 is formed over first gate structure 122b to protect first gate structure 122b. Similarly, second gate structure 124b includes a second gate dielectric layer 130b and a second gate electrode layer 132b formed over second gate dielectric layer 130b in accordance with some embodiments. In addition, a second hard mask structure 224 is formed over second gate structure 124b to protect second gate structure 124b. Spacers 134b are formed on the sidewalls of first gate structure 122b and second gate structure 124b.

It should be noted that, although not shown in the figures, the third gate structure and the fourth gate structure may also include the similar structures as first gate structure 122b and second gate structure 124b do. That is, a third hard mask structure 221 and a fourth hard mask structure 223 are formed over the third gate structure and the fourth gate structure respectively, as shown in FIG. 4A in accordance with some embodiments.

Next, a first source/drain structure 136b, a second source/drain structure 138b, a third source/drain structure 135b, and a fourth source/drain structure 137b are formed adjacent to first gate structure 122b, second gate structure 124b, the third gate structure, and the fourth gate structure respectively. Afterwards, an interlayer dielectric layer 140b is formed over a front side 104b of thinned substrate 102b' in accordance with some embodiments.

A first contact trench is formed over first gate structure 122b to expose the top surface of first gate structure 122b (e.g. the top surface of first gate electrode layer 128b). That is, the first contact trench is formed through first hard mask structure 222. In addition, a second contact trench is formed over second gate structure 124b to expose the top surface of second gate structure 124b (e.g. the top surface of second gate electrode layer 132b). That is, the second contact trench is formed through second hard mask structure 224. A third contact trench and a fourth contact trench may also be formed over the third gate structure and the fourth gate structure.

Furthermore, a wide contact trench is formed to expose isolation structure 112 and portions of first source/drain structure 136b, second source/drain structure 138b, third source/drain structure 135b, and fourth source/drain structure 137b. In addition, the wide contact trench may also be formed over portions of first gate structure 122b, second gate structure 124b, the third gate structure, and the fourth gate structure. However, as described above, first hard mask structure 222, second hard mask structure 224, third hard mask structure 221, and fourth hard mask structure 223 are formed, so that first gate structure 122b, second gate structure 124b, the third gate structure, and the fourth gate structure will not be exposed by the wide contact trench. Accordingly, the wide contact trench can be self-aligned to first source/drain structure 136b, second source/drain structure 138b, third source/drain structure 135b, and fourth source/drain structure 137b, and no complicated aligning process is required.

Next, a first contact 148b, a second contact 150b, a third contact 149b, a fourth contact 149b, and a wide contact 152b are formed, as shown in FIG. 4A in accordance with some embodiments. As shown in FIG. 4A, wide contact 152b is formed over first source/drain structure 136b, second source/drain structure 138b, third source/drain structure 135b, and fourth source/drain structure 137b, so that first source/drain structure 136b, second source/drain structure 138b, third source/drain structure 135b, and fourth source/drain structure 137b can be all electrically connect through wide contact 152b. That is, additional conductive features to connect these source/drain structures are not required.

In addition, since first hard mask structure 222, second hard mask structure 224, third hard mask structure 221, and fourth hard mask structure 223 are formed, wide contact 152b can be formed in a self-aligned etching process. Therefore, the risk of misalignment can be prevented. In some embodiments, wide contact 152b overlaps with isolation structure 112b, a portion of first source/drain structure 118b, and a portion of second source/drain structure 120b and is formed on a portion of first hard mask structure 222.

In addition, since wide contact 152b can be self-aligned to first source/drain structure 136b, second source/drain structure 138b, third source/drain structure 135b, and fourth source/drain structure 137b, the sizes of first source/drain structure 136b, second source/drain structure 138b, third source/drain structure 135b, and fourth source/drain structure 137b can be reduced. In some embodiments, a shortest distance $D_2$ between the sidewall of first gate structure 122b and the sidewall of isolation structure 112b is smaller than 100-nm. In some embodiments, a shortest distance $D_2$ between the sidewall of first gate structure 122b and the sidewall of isolation structure 112b is in a range from about 50 nm to about 100 nm. When the distance between first gate structure 122b and isolation structure 112b is reduced, the space form forming first light sensing region 118b can be increased. Therefore, the performance of image sensor structure 100b can be improved.

Furthermore, as shown in FIG. 4A, since wide contact 152b is a self-aligned contact, the size of first source/drain structure 136b, second source/drain structure 138b, third source/drain structure 135b, and fourth source/drain structure 137b can be reduced. Accordingly, the area for forming first light sensing region 118b, second light sensing region 120b, third light sensing region 117b, and fourth light sensing region 119b can be increased.

Similar to image sensor structure 100a, image sensor structure 100b also includes an interconnect structure 154b, a buffer layer 160b, and a carrier substrate 162b formed over interlayer dielectric layer 140b in accordance with some embodiments. Interconnect structure 154b includes conductive features 158b formed in a dielectric layer 156b. In addition, an antireflective layer 164b, a passivation layer 166b, a color filter layer 168b, and a microlens layer 170b are formed over a thinned back side 106b' of thinned substrate 102b' in accordance with some embodiments. In some embodiments, color filter layer 168b includes a first color filter 172b and a second color filter 174b, and microlens layer 170b includes a first microlens 176b and a second microlens 178b.

Figure 5:
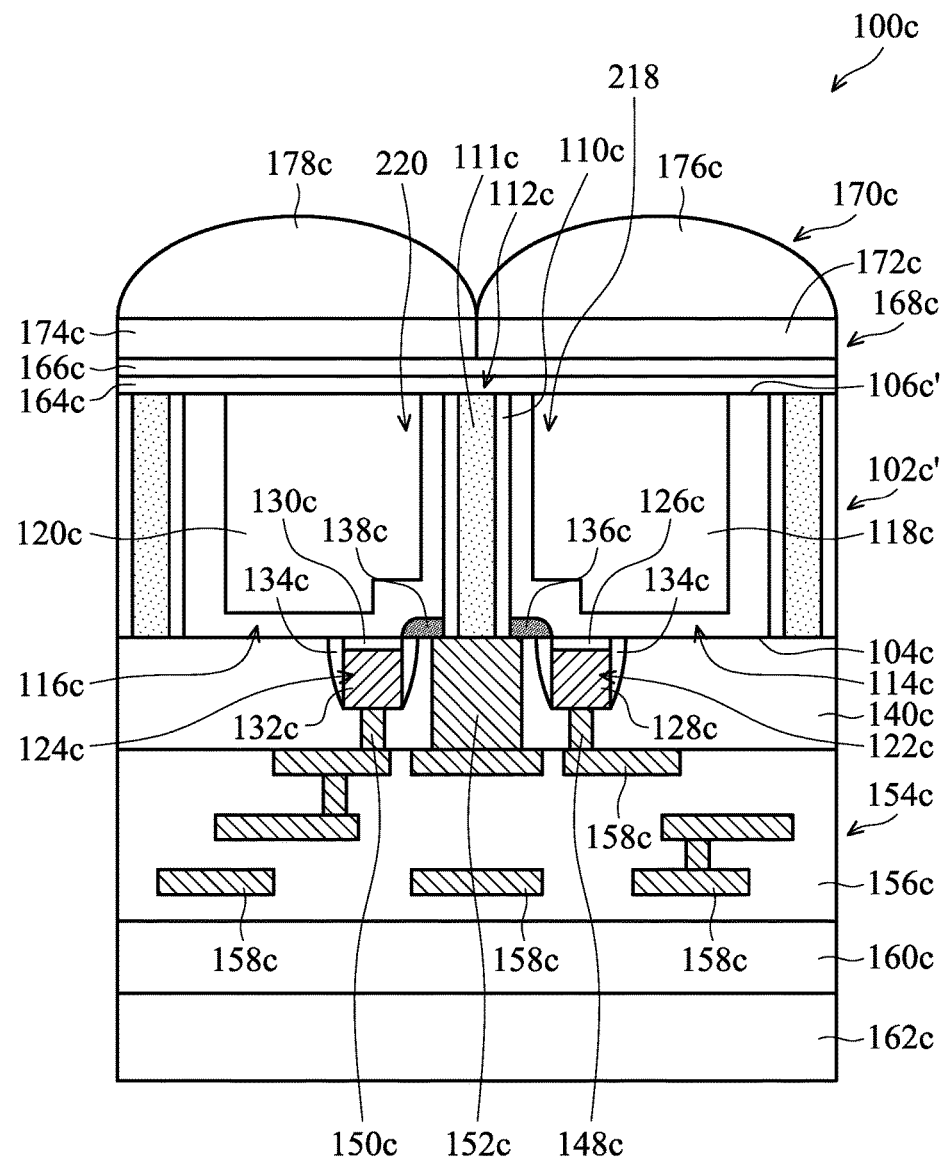
FIG. 5 is a cross-sectional representation of an image sensor structure in accordance with some embodiments.

FIG. 5 is a cross-sectional representation of an image sensor structure 100c in accordance with some embodiments. Image sensor structure 100c is similar to image sensor structure 100a described previously, except the light sensing regions extend below the source/drain structures. Some processes and materials used to form image sensor structure 100c may be similar to, or the same as, those used to form image sensor structure 100a described previously and are not repeated herein.

Similar to image sensor structure 100a, a thinned substrate 102c' is separated into a first region 114c and a second region 116c, and a first light sensing region 118c and a second light sensing region 120c are formed in first region 114c and second region 116c respectively. In some embodiments, isolation structure 112c includes liners 110c and an isolation material 111c formed between liners 110c.

In addition, a first gate structure 122c and a second gate structure 124c are formed over first region 114c and second region 116c respectively. As shown in FIG. 5, first gate structure 122c includes a first gate dielectric layer 126c and a first gate electrode layer 128c formed over first gate dielectric layer 126c in accordance with some embodiments. Similarly, second gate structure 124c includes a second gate dielectric layer 130c and a second gate electrode layer 132c formed over second gate dielectric layer 130b in accordance with some embodiments. Spacers 134c are formed on the sidewalls of first gate structure 122c and second gate structure 124c.

A first source/drain structure 136c and a second source/drain structure 138c are formed adjacent to first gate structure 122c and second gate structure 124c respectively, and an interlayer dielectric layer 140c is formed over a front side 104c of thinned substrate 102c' in accordance with some embodiments. Furthermore, a first contact 148c, a second contact 150c, and a wide contact 152c are formed, as shown in FIG. 5 in accordance with some embodiments.

Similar to image sensor structure 100a, image sensor structure 100c also includes an interconnect structure 154c, a buffer layer 160c, and a carrier substrate 162c formed over interlayer dielectric layer 140c in accordance with some embodiments. Interconnect structure 154c includes conductive features 158c formed in a dielectric layer 156c. In addition, an antireflective layer 164c, a passivation layer 166c, a color filter layer 168c, and a microlens layer 170c are formed over a thinned back side 106c' of thinned substrate 102c' in accordance with some embodiments. In some embodiments, color filter layer 168c includes a first color filter 172c and a second color filter 174c, and microlens layer 170c includes a first microlens 176c and a second microlens 178c.

As shown in FIG. 5, first light sensing region 118c includes an extending portion 218, and extending portion 218 overlaps with a portion of first source/drain structure 136c. However, extending portion 218 of first light sensing region 118c has a thickness smaller than other portions of first light sensing region 118c, so that the extending portion 218 will not be contact with first source/drain structure 136c.

Similarly, second light sensing region 120c includes an extending portion 220, and extending portion 220 overlaps with a portion of second source/drain structure 138c. However, extending portion 220 of second light sensing region 120c has a thickness smaller than other portions of second light sensing region 120c, so that the extending portion 220 will not be contact with second light sensing region 120c. The formation of extending portions 218 and 220 enable to increase the size of the light sensing regions, and therefore the quantum efficient of image sensor structure 100c may be improved.

It should be noted that the numbers of the light sensing regions, color filters, and microlens shown in FIGS. 1 to 5 are merely examples and the scope of the disclosure is not intended to be limiting. In addition, the relative size of each feature in the figures may not be changed or simplified for better understanding the concept of the disclosure, but the scope of the disclosure is not intended to be limiting.

Generally, isolation structures are used to separate neighboring light sensing regions in image sensor structures. However, as the size of the image sensor structure shrink, isolation formed by implantation may not be able to prevent cross-talk and/or blooming. Therefore, isolation structure 112 (or isolation structures 112b and 112c) formed by forming isolation trench 108 and depositing isolating material, such as oxide, in isolation trench 108 is formed in accordance with some embodiments. Isolation structure 112 can be seen as a deep trench isolation structure, and the risk of cross-talk and/or blooming can be reduced.

However, when isolation structure 112, which is formed by isolation material, is formed to separate first light sensing region 118 and second light sensing region 120, sharing the pixels (e.g. source/drain structures) also become difficult. For example, complicated and additional conductive features may be required. However, the space for forming these conductive features may result in smaller sensing area and higher capacitance. Therefore, in some embodiments, wide contact 152 (or wide contacts 152b and 152c) is formed to connect first source/drain structure 136 and second source/drain structure 138 formed at the opposite sides of isolation structure 112. That is, additional and complicated conductive features are not required, and the size of first source/drain structure 136 and second source/drain structure 138 can be reduced. Accordingly, the capacitance of the floating diffusion node may be reduced.

Furthermore, since the size of first source/drain structure 136 and second source/drain structure 138 may be reduced, the size of first light sensing region 118 and second light sensing region 120 may be enlarged. Therefore, the quantum efficiency may be increased, and the performance of image sensor structure 100a (or image sensor structures 100b and 100c) may be improved.

In addition, as shown in FIG. 4B, first hard mask layer 222 is formed over first gate structure 122b in accordance with some embodiments. Therefore, wide contact 152b may be self-aligned to first light sensing region 136b and second light sensing region 138b. Accordingly, the size of first light sensing region 136b and second light sensing region 138b may be further reduced and the size of first light sensing region 118b and second light sensing region 120b may be further enlarged.

Embodiments of image sensor structures and methods for manufacturing the same are provided. The image sensor structure includes an isolation structure formed in a substrate. A first light sensing region is formed in a first region of the substrate, and a second light sensing region is formed in a second region of the substrate. A first source/drain structure is formed in the first region adjacent to one side of the isolation structure, and a second source/drain structure is formed in the second region adjacent to the other side of the isolation structure. A contact is formed over a portion of the first source/drain structure, the isolation structure, and a portion of the second source/drain structure, so that the first source/drain structure and the second source/drain structure can be electrically connected by the contact.

In some embodiments, an image sensor structure is provided. The image sensor structure includes a substrate including a first light sensing region and a second light sensing region. The image sensor structure further includes an isolation structure formed through the substrate to separate the first light sensing region and the second light sensing region and a first source/drain structure and a second source/drain structure formed at a front side of the substrate. In addition, the first source/drain structure and the second source/drain structure are located at opposite sides of the isolation structure. The image sensor structure further includes a contact formed over the isolation structure, a portion of the first source/drain structure, and a portion of the second source/drain structure.

In some embodiments, an image sensor structure is provided. The image sensor structure includes a substrate and an isolation structure formed through the substrate to divide the substrate into a first region and a second region. The image sensor structure further includes a first light sensing region formed in the first region of the substrate and a second light sensing region formed in the second region of the substrate. The image sensor structure further includes a first gate structure formed over the first region of the substrate and a second gate structure formed over the second region of the structure. The image sensor structure further includes a first source/drain structure formed adjacent to the first gate structure and a second source/drain structure formed adjacent to the second gate structure. The image sensor structure further includes a contact overlapping with the isolation structure, a portion of the first source/drain structure, and a portion of the second source/drain structure.

In some embodiments, a method for manufacturing an image sensor structure is provided. The method for manufacturing the image sensor structure includes forming an isolation structure in a substrate to divide the substrate into a first region and a second region and forming a first light sensing region in the first region and a second light sensing region in the second region. The method for manufacturing the image sensor structure further includes forming a first gate structure over the first region and a second gate structure over the second region. In addition, the first gate structure and the second gate structure are positioned at a front side of the substrate. The method for manufacturing the image sensor structure further includes forming a first source/drain structure adjacent to the first gate structure and a second source/drain structure adjacent to the second gate structure and forming an interlayer dielectric layer over the front side of the substrate to cover the first gate structure and the second gate structure. The method for manufacturing the image sensor structure further includes forming a contact trench through the interlayer dielectric layer, such that a portion of first source/drain structure, a portion of second source/drain structure, and the isolation structure are exposed by the contact trench and forming a contact in the contact trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor structure, comprising:
    a substrate comprising a first light sensing region and a second light sensing region;
    an isolation structure formed through the substrate to separate the first light sensing region and the second light sensing region;
    a first source/drain structure and a second source/drain structure formed at a front side of the substrate, wherein the first source/drain structure and the second source/drain structure are located at opposite sides of the isolation structure;
    a contact formed over the isolation structure, a portion of the first source/drain structure, and a portion of the second source/drain structure.

2. The image sensor structure as claimed in claim 1, wherein the isolation structure is made of silicon nitride, silicon oxide, or polysilicon.

3. The image sensor structure as claimed in claim 1, wherein the isolation structure extends from the front side of the substrate to a back side of the substrate.

4. The image sensor structure as claimed in claim 1, wherein a width of the isolation structure is smaller than a width of the contact.

5. The image sensor structure as claimed in claim 1, further comprising:
    an interconnect structure formed over the front side of the substrate; and
    a color filter layer formed over a back side of the substrate.

6. The image sensor structure as claimed in claim 1, further comprising:
    a first gate structure formed adjacent to the first source/drain structure; and
    a second gate structure formed adjacent to the second source/drain structure.

7. The image sensor structure as claimed in claim 6, wherein a shortest distance between a sidewall of the first gate structure and a sidewall of the isolation structure is smaller than 150 nm.

8. An image sensor structure, comprising:
a substrate;
an isolation structure formed through the substrate to divide the substrate into a first region and a second region;
a first light sensing region formed in the first region of the substrate;
a second light sensing region formed in the second region of the substrate;
a first gate structure formed over the first region of the substrate;
a second gate structure formed over the second region of the structure;
a first source/drain structure formed adjacent to the first gate structure;
a second source/drain structure formed adjacent to the second gate structure; and
a contact overlapping with the isolation structure, a portion of the first source/drain structure, and a portion of the second source/drain structure.

9. The image sensor structure as claimed in claim 7, further comprising:
a first hard mask structure formed over the first gate structure,
wherein a portion of the contact is formed on a portion of the first hard mask structure.

10. The image sensor structure as claimed in claim 7, further comprising:
an interconnect structure formed over a front side of the substrate;
a color filter layer formed over a back side of the substrate; and
a microlens layer formed over the color filter layer.

11. The image sensor structure as claimed in claim 7, wherein a width of the isolation structure is smaller than a width of the contact.

12. The image sensor structure as claimed in claim 7, wherein the contact is in direct contact with a top surface of the isolation structure, a portion of a top surface of the first source/drain structure, and a portion of a top surface of the second source/drain structure.

13. The image sensor structure as claimed in claim 7, wherein the isolation structure extends from a front side of the substrate to a back side of the substrate.

14. An image sensor structure, comprising:
a first light sensing region and a second light sensing region formed in a substrate;
an isolation structure formed through the substrate to separate the first light sensing region and the second light sensing region;
a first source/drain structure formed adjacent to the first light sensing region and a second source/drain structure formed adjacent to the second light sensing region; and
a contact formed on the isolation structure and extending on a portion of the first source/drain structure and a portion of the second source/drain structure.

15. The image sensor structure as claimed in claim 14, wherein the isolation structure is made of silicon nitride, silicon oxide, or polysilicon.

16. The image sensor structure as claimed in claim 14, wherein the isolation structure extends from a front side of the substrate to a back side of the substrate.

17. The image sensor structure as claimed in claim 14, wherein a width of the isolation structure is smaller than a width of the contact.

18. The image sensor structure as claimed in claim 14, further comprising:
an interconnect structure formed over a front side of the substrate; and
a color filter layer formed over a back side of the substrate.

19. The image sensor structure as claimed in claim 14, further comprising:
a first gate structure formed adjacent to the first source/drain structure,
wherein a portion of the contact overlaps with the first gate structure.

20. The image sensor structure as claimed in claim 19, further comprising:
a hard mask structure formed over the first gate structure,
wherein the first gate structure and the contact are separated by the hard mask structure.

* * * * *